US008350745B2

United States Patent
Kasperkovitz et al.

(10) Patent No.: US 8,350,745 B2
(45) Date of Patent: Jan. 8, 2013

(54) ANTI JAMMING SYSTEM

(75) Inventors: Wolfdietrich Georg Kasperkovitz, Waalre (NL); Harry Barend Schoonheijm, Geldrop (NL)

(73) Assignee: Semiconductor Ideas to the Market (ITOM) B.V., Breda (NL)

( * ) Notice: Subject to any disclaimer, the term of this patent is extended or adjusted under 35 U.S.C. 154(b) by 347 days.

(21) Appl. No.: 12/682,250

(22) PCT Filed: Oct. 9, 2008

(86) PCT No.: PCT/EP2008/008531
§ 371 (c)(1),
(2), (4) Date: Jul. 8, 2010

(87) PCT Pub. No.: WO2009/046982
PCT Pub. Date: Apr. 16, 2009

(65) Prior Publication Data
US 2010/0265116 A1    Oct. 21, 2010

(30) Foreign Application Priority Data

Oct. 10, 2007 (EP) .................................... 07019812

(51) Int. Cl.
*G01S 7/36* (2006.01)
(52) U.S. Cl. ............... 342/16; 342/18; 342/19; 342/21
(58) Field of Classification Search .............. 342/13–19, 342/21, 159
See application file for complete search history.

(56) References Cited

U.S. PATENT DOCUMENTS

| 5,539,407 | A * | 7/1996 | Scholz ............................ 342/17 |
| 5,790,067 | A * | 8/1998 | Van Ommeren et al. ....... 342/17 |
| 6,268,821 | B1 * | 7/2001 | Shrader et al. .................. 342/17 |
| 6,313,782 | B1 * | 11/2001 | Lehan et al. ..................... 342/16 |
| 6,961,017 | B1 * | 11/2005 | Naylor et al. ............. 342/357.29 |
| 2009/0128403 | A1 * | 5/2009 | Bryant et al. ............ 342/357.02 |
| 2010/0265116 | A1 * | 10/2010 | Kasperkovitz et al. ......... 342/16 |
| 2010/0283658 | A1 * | 11/2010 | Kasperkovitz .................. 342/16 |
| 2011/0102258 | A1 * | 5/2011 | Underbrink et al. ..... 342/357.47 |

FOREIGN PATENT DOCUMENTS

EP    2048775 A1 *    4/2009

OTHER PUBLICATIONS

Grant, P.M.; Collins, J.H.; , "Introduction to electronic warfare," Communications, Radar and Signal Processing, IEE Proceedings F , vol. 129, No. 3, pp. 113-132, Jun. 1982.*

(Continued)

*Primary Examiner* — John B Sotomayor
(74) *Attorney, Agent, or Firm* — Robert M. McDermott, Esq.

(57) ABSTRACT

Anti jamming system comprising a tunable negative jamming signal feedback loop for feedback suppression of a received jamming signal, including an receiver receiving an jamming signal followed by a replica jamming signal generator for generating an replica jamming signal. The receiver comprising a zero IF PLL receiver having a synchronous demodulator and a phase detector, signal inputs thereof being coupled to said input means and carrier inputs coupled to in-phase and phase quadrature oscillator outputs, respectively, of a local voltage controlled oscillator (VCO), said VCO receiving a tuning control signal for tuning the zero IF PLL receiver at the carrier frequency of the jamming signal. The VCO is included in a phase locked loop (PLL) comprising subsequent to the VCO, said phase detector and a loop filter. The replica jamming signal generator includes a modulator with a baseband signal input coupled to an output of said synchronous demodulator and a carrier input coupled to the in-phase oscillator output of the VCO, an output of said modulator being negatively fedback to the input of the receiver.

20 Claims, 7 Drawing Sheets

OTHER PUBLICATIONS

Figure 1:
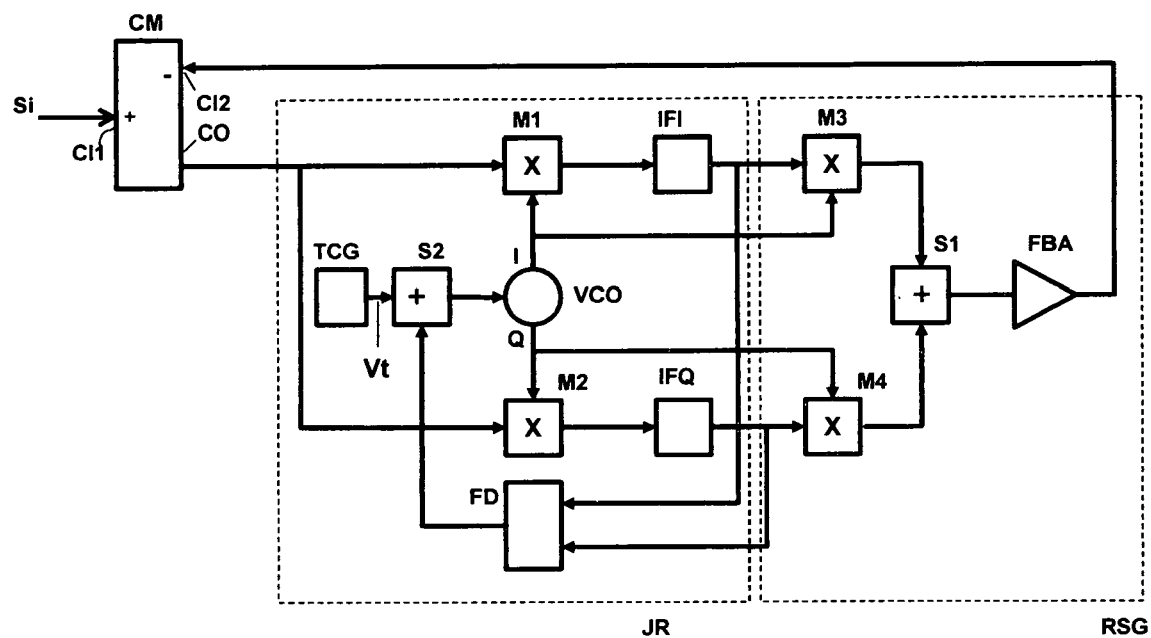

Schuerger, J.; Garmatyuk, D.; , "Deception jamming modeling in radar sensor networks," Military Communications Conference, 2008. MILCOM 2008. IEEE , vol., No., pp. 1-7, Nov. 16-19, 2008.*

Blair, W.D.; Watson, G.A.; Kirubarajan, T.; Bar-Shalom, Y.; , "Benchmark for radar allocation and tracking in ECM," Aerospace and Electronic Systems, IEEE Transactions on , vol. 34, No. 4, pp. 1097-1114, Oct. 1998.*

* cited by examiner

ANTI JAMMING SYSTEM

The invention relates to an anti jamming system with improved jamming suppression techniques and, more specifically, to a technique for improved suppression of (suppressed) carrier modulated jamming signals, such as occurring in e.g. RF broadcast radio and TV systems, spread spectrum transmission systems, such as the Global Positioning System (GPS) and/or communication systems, such as GSM and CDMA and/or radar systems.

An anti jamming system for improved jamming suppression of wideband radar systems is known, e.g. from UK Patent Application GB 2 215 565. This known anti jamming system is applied in a superheterodyne RF receiver using in an intermediate frequency (IF) signal path thereof an IF notch filter per each jamming signal. Suppression of an incoming first jamming signal is obtained by a first frequency conversion of said first jamming signal such, that the resulting first IF jamming signal coincides with the center frequency of a first IF notch filter.

In a subsequent mixer stage, a second frequency conversion is provided which in addition to the preceding first frequency causes an incoming second jamming signal to coincide with the center frequency of a second notch filter, etc.

The concept of the known anti jamming system is highly demanding with regard to the accuracy and performance of the circuitry needed, such as e.g. the stability of the notch filters and oscillators.

In consequence, amongst other things, it is an object of the present invention to provide a universal anti jamming system which can be implemented in an analogue or digital way in each signal processing system where jamming signals result in reception problems and which can be used in a much wider field of application than the conventional anti jamming system, including RF broadcast radio and TV systems, spread spectrum transmission systems, such as the Global Positioning System (GPS) and/or communication systems, such as GSM and CDMA and/or radar systems.

Another object of the invention is to improve the performance in the suppression of jamming signals in terms of selectivity, robustness and rate of suppression.

Now therefore, an anti jamming system according to the invention comprising signal combining means having a first input receiving an input signal including a carrier modulated jamming signal is characterized by a negative jamming signal feedback loop for feedback suppression of said jamming signal from an output of said signal combining means to a second input thereof, said feedback loop including a quadrature frequency locked loop (FLL) receiver for demodulating and selecting said jamming signal followed by a replica jamming signal generator for generating a replica jamming signal.

The invention is based on the recognition that a narrowband selection of an incoming jamming signal can be obtained by using an FLL jamming signal receiver with quadrature signal processing for demodulating and selecting said jamming signal followed by a replica jamming signal generator for generating a replica jamming signal using opposite quadrature signal processing. Such FLL jamming signal receiver not only demodulates the incoming jamming signal into its base band component or envelope signal thus allowing for a narrowband baseband selection thereof, it also preserves the exact carrier frequency and phase of the jamming signal. With these preserved signal components a replica jamming signal can be generated with said replica jamming signal generator, which accurately corresponds to the original jamming signal. The jamming signal may be of any type, such as a double sideband carrier modulated signal, a vestigial sideband carrier modulated signal, a single sideband carrier modulated signal, etc.

According to the invention, the suppression of the jamming signal received at the signal combining means of the anti jamming system is obtained by including the FLL jamming signal receiver and the replica jamming signal generator in a negative jamming signal feedback loop having input and outputs coupled to said signal combining means. To obtain an effective reduction of the incoming jamming signal, the phase and gain requirements of the loop are easy to comply with in that the open loop gain of the jamming signal in the feedback loop only has to be sufficiently large, whereas the loop only has to reverse the signal phase, i.e. effectuate a 180° phase shift, of the jamming signal compared to the phase of the incoming jamming signal. This allows for a robust implementation of the anti jamming system.

An embodiment of an anti jamming system according to the invention allowing for a costeffective implementation is characterized by by said FLL receiver comprising a pair of in-phase and phase quadrature tuning mixers, signal inputs thereof being coupled to the output of said signal combining means and carrier inputs thereof being coupled to a pair of in-phase and phase quadrature oscillator outputs of a local voltage controlled oscillator (VCO), said VCO being included in said frequency locked loop (FLL) comprising subsequent to the VCO, said pair of in-phase and phase quadrature tuning mixers and a frequency detector, an output of said frequency detector being coupled to a frequency control input of said VCO to lock the frequency of the VCO to a carrier frequency of the jamming signal, said VCO providing in-phase and phase quadrature oscillator signals to the carrier inputs of the pair of in-phase and phase quadrature tuning mixers for a downconversion of said jamming signal into a quadrature IF jamming signal, and outputs of said pair of in-phase and phase quadrature tuning mixers being coupled through in-phase and phase quadrature IF filters to a pair of in-phase and phase quadrature tracking modulators included in said replica jamming signal generator, carrier inputs thereof being coupled to the pair of in-phase and phase quadrature oscillator outputs of said VCO for an upconversion of said quadrature IF jamming signal into a quadrature jamming signal, outputs of said in-phase and phase quadrature tracking modulators being coupled to a summer stage to provide a replica jamming signal being negatively feedback from said summer stage to the second input of the signal combining means.

Such embodiment may preferably be characterized in that in-phase and phase quadrature oscillator signals of said quadrature pair of oscillator signals are respectively supplied to in-phase and phase quadrature tuning mixers of said quadrature pair of tuning mixers, said in-phase and phase quadrature tuning mixers being coupled through in-phase and phase quadrature IF filters of said quadrature pair of IF filters to in-phase and phase quadrature tracking modulators of said quadrature pair of tracking modulators, respectively, said in-phase and phase quadrature tracking modulators being supplied with the in-phase and phase quadrature oscillator signals, respectively, and coupled first and second inputs of the summer stage.

An embodiment of an anti jamming system according to the invention is characterized by said signal combining means comprising an adder for mutually adding the carrier modulated jamming signal within the input signal supplied to the first input of the signal combining means and the phase reversed replica jamming supplied by the signal replica jamming signal generator to the second input of the signal combining means, providing a feedback suppression of the carrier modulated jamming signal within the input signal, said input signal with suppressed carrier modulated jamming signal being supplied to the output of the signal combining means.

This measure allows for a simple, cost effective implementation of the signal combining means in which the signal combining means provides the function of an adder or summer, if the replica jamming signal provided by the replica jamming signal generator is phase reversed with respect to the incoming jamming signal, or alternatively of a difference or subtracting circuit, if the replica jamming signal provided by the replica jamming signal generator is in phase with the incoming jamming signal.

An embodiment of an anti jamming system according to the invention is characterized by the use of a zero IF FLL jamming signal receiver in which each of said in-phase and phase quadrature IF filters provide a low pass filter characteristic. Such low pass filter may alternatively be implemented as integrator.

Another embodiment of an anti jamming system according to the invention is characterized by the use of a non-zero superheterodyne FLL jamming signal receiver in which each of said in-phase and phase quadrature IF filters provide a band pass filter characteristic.

For an adequate suppression of the incoming jamming signal with the replica jamming signal at the signal combining means of the anti jamming system, the negative jamming signal feedback loop includes amplification means providing an open loop gain which is substantially larger than unity.

An embodiment providing automatic control of the loop gain is characterized by an envelope detector being coupled between outputs of the in-phase and phase quadrature tuning mixers and a gain control input of said amplification means, varying the gain of said amplification means in correspondence with the amplitude of the envelope of the IF jamming signal.

An embodiment providing an extra degree of freedom allowing optimizing the FLL function independent from an optimized dimensioning of the negative jamming signal feedback loop is characterized in that the FLL includes in-phase and phase quadrature FLL loop filters preceding the frequency detector.

To avoid phase errors occurring in the circuitry of the feed back loop from affecting the negative feedback suppression of jamming signals, RF phase correction means may be coupled between the local voltage controlled oscillator (VCO) and the quadrature pair of tracked modulators and/or IF phase correction means may be coupled between the quadrature pair of in-phase and phase quadrature IF filters and the quadrature pair of tracked modulators.

An embodiment of an anti jamming system according to the invention is characterized by a tuning control signal generator deriving said tuning control signal from predetermined tuning data defining the carrier frequency of a jamming signal.

This measure is applicable when the carrier frequency of the jamming signal to be suppressed is known. This may occur e.g. with RF broadcast radio or TV receivers located in the vicinity of Bluetooth transceivers or WiFi base stations, transmitting carrier signals at fixed frequencies and jamming RF radio and/or TV stations.

To suppress jamming signals having unknown carrier frequencies, the invention is characterized by search tuning system using a microprocessor executing per each negative jamming signal feedback loop the steps of:

deactivate the negative jamming feedback suppression;
scanning the RF frequency band to detect carrier frequencies of jamming signals exceeding above a predetermined threshold value;
storing the detected carrier frequencies;
upon completion of the scanning operation, selecting the carrier frequency of the strongest jamming signal frequency not coinciding with the RF frequency of a wanted signal;
supplying a tuning control signal to the VCO to tune the FLL receiver at the carrier of the so selected jamming signal;
activate the negative jamming feedback suppression.

The invention is applicable to a plurality of frequency separated jamming signals by using a plurality of negative jamming signal feedback loops including said negative jamming signal feedback loop, said feedback loops being tuned to the mutually different carrier frequencies of said jamming signals.

The invention also relates to an RF or IF or baseband receiver including such anti jamming system which can be implemented in an analog or digital way.

An RF or IF or baseband receiver according to the invention is characterized by said anti jamming system being included in an RF signal path, in an IF signal path or alternatively, in the baseband (in radio receivers the audio frequency (AF) band) of the receiver.

The above and other object features and advantages of the present invention will be discussed in more detail hereinafter with reference to the disclosure of preferred embodiments wherein like or similar elements are designated by the same reference numeral through the several views, and in particular with reference to the appended Figures, that show in:

FIG. 1 a block diagram of a first embodiment of an anti jamming system according to the invention using an FLL receiver with quadrature signal processing.

Figure 1A:
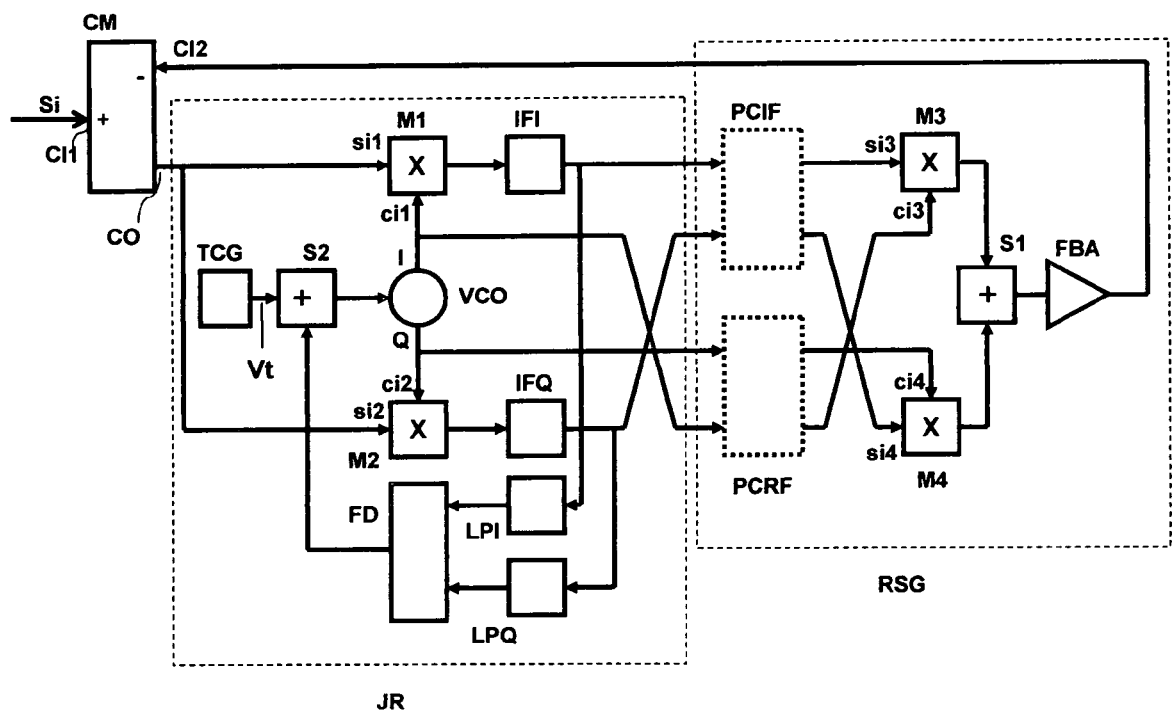

FIG. 1A a block diagram of an embodiment of an anti jamming system according to the invention using an FLL receiver with quadrature signal processing and phase correction.

Figure 2A:
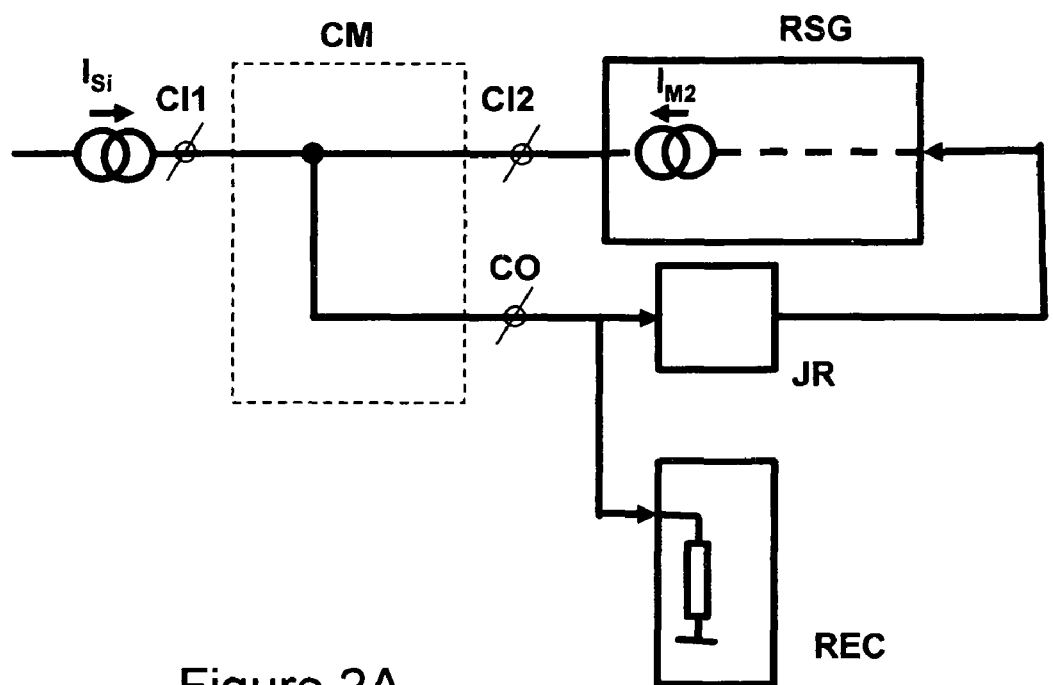

FIG. 2A a schematic diagram of a node implementation of the signal combining means for use in an anti jamming system according to the invention.

Figure 2B:
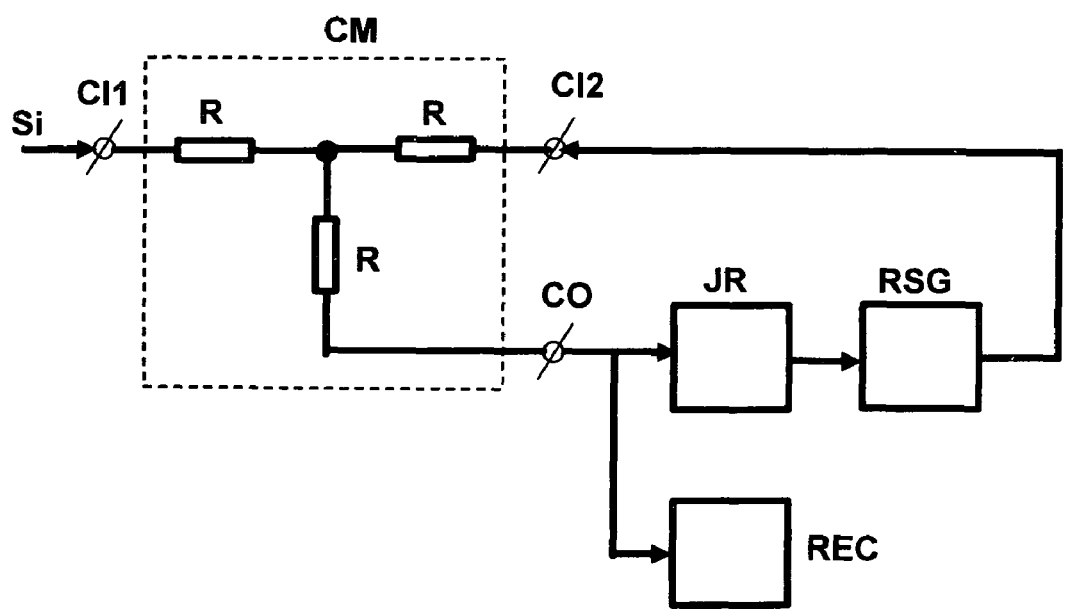

FIG. 2B a schematic diagram of an implementation of a signal combining means by means of an adder for use in an anti jamming system according to the invention.

Figure 3:
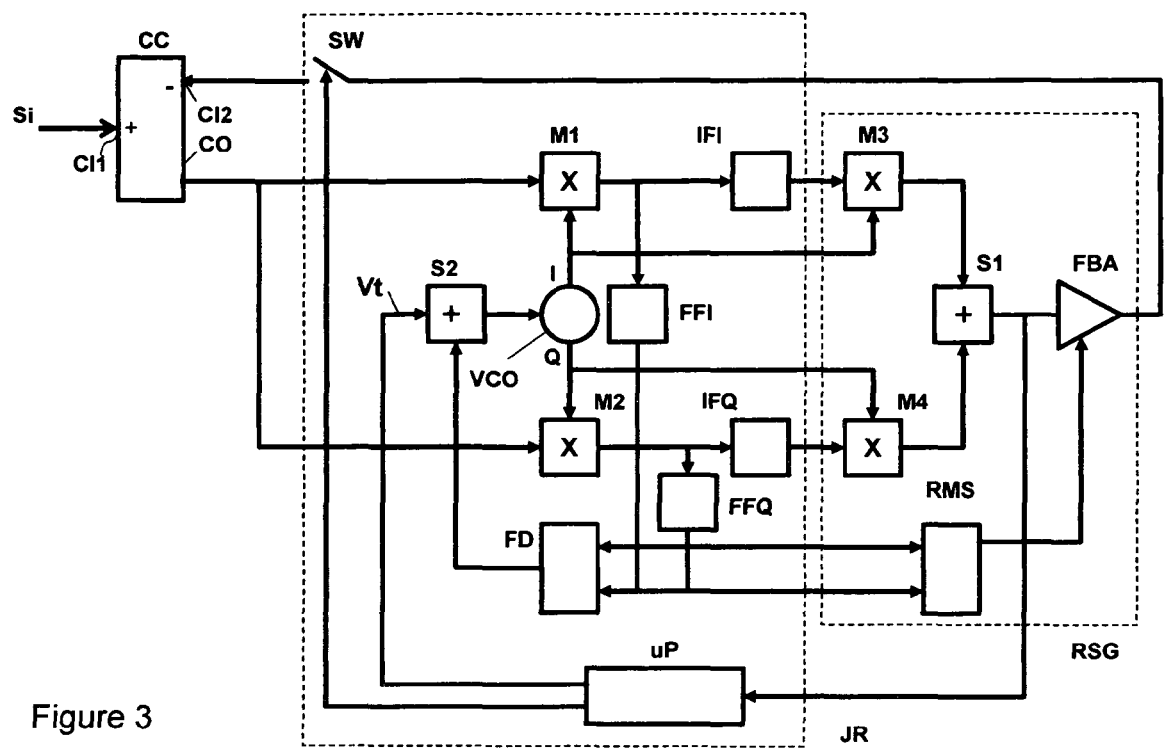

FIG. 3 a block diagram of an embodiment of an anti jamming system according to the invention with automatic search of jamming signals.

Figure 4:
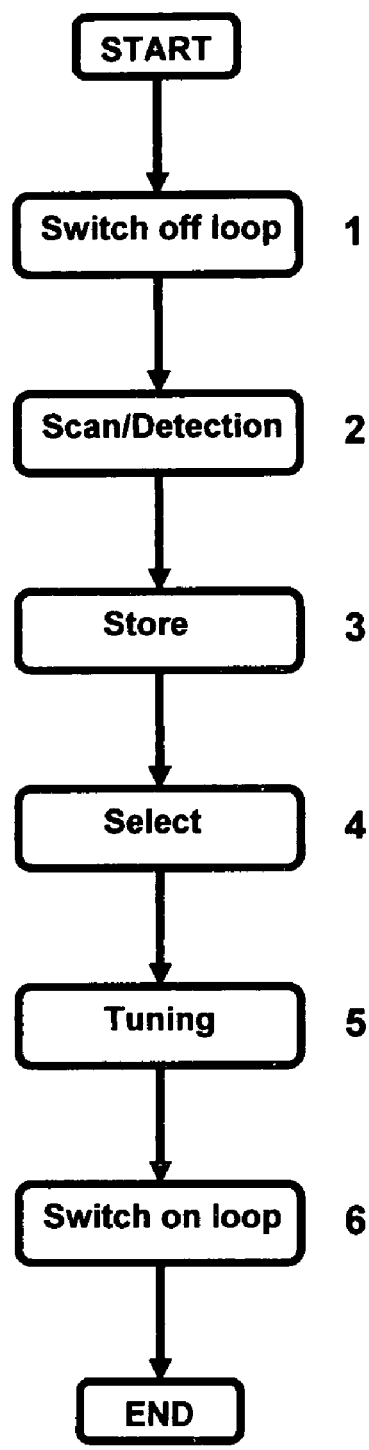

FIG. 4 a flow chart illustrating the steps executed by a microprocessor for automatic jamming signal search tuning in an anti jamming system according to the invention.

Figure 5:
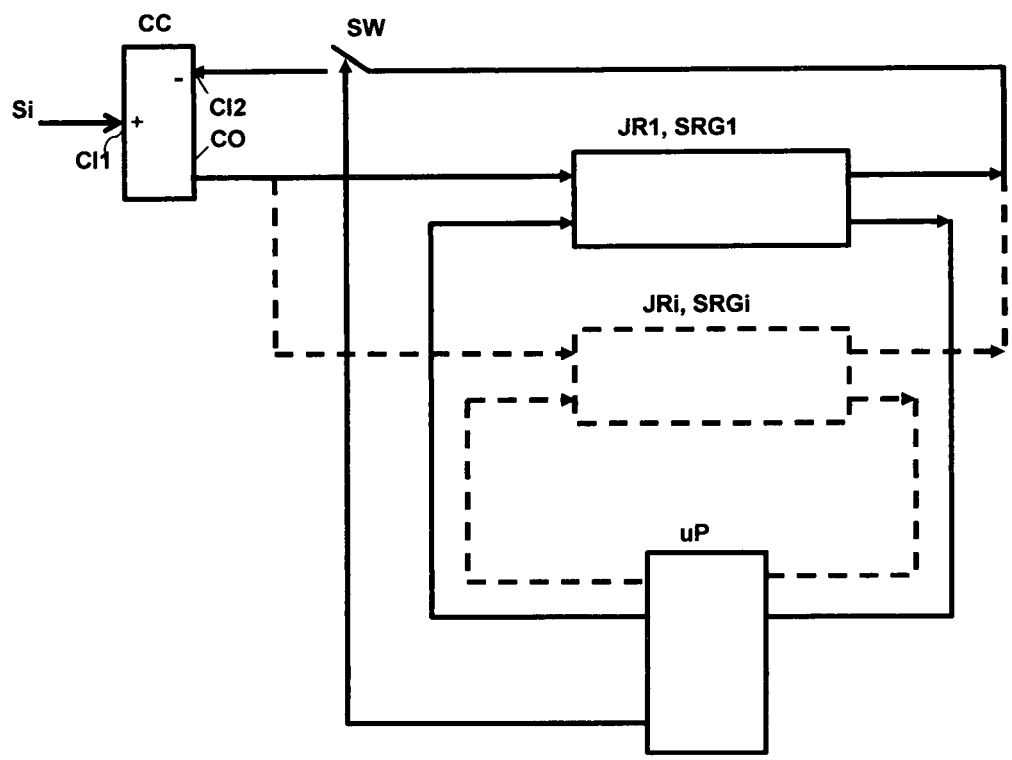

FIG. 5 a block diagram of an anti jamming system according to the invention for suppressing a plurality of jamming signals.

Figure 6A:
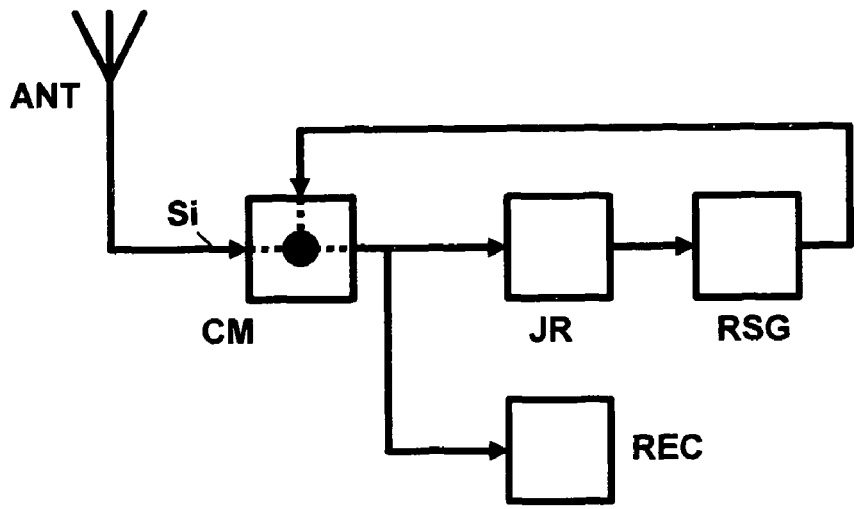

FIG. 6A a block diagram of an RF receiver using an anti jamming system according to the invention in the RF signal path.

Figure 6B:
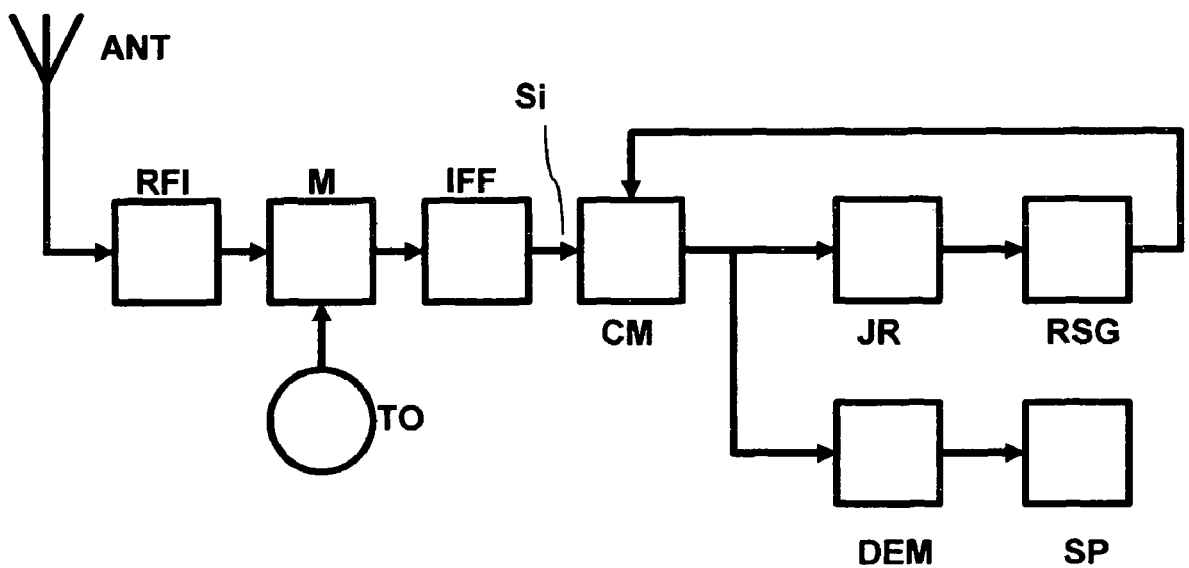

FIG. 6B a block diagram of a receiver using an anti jamming system according to the invention in the IF signal path.

FIG. 1 shows an anti jamming system having signal combining means CM, receiving at a first input CI1 an input signal Si including a jamming signal. An output CO of the signal combining means CM is coupled to a jamming signal receiver JR for receiving said jamming signal followed by a replica jamming signal generator RSG for generating a replica jamming signal. An output of the replica jamming signal generator RSG is negatively coupled to a second input CI2 of the signal combining means CM and forms therewith a negative jamming signal feedback loop for feedback suppression of said jamming signal from the output CO of the signal combining means CM back to the second input CI2 thereof. This results in a feedback suppression of a received jamming signal in the signal combining means CM, which increases with the open loop gain as provided by the jamming signal receiver JR and the replica jamming signal generator RSG, preventing strong jamming signals from occurring at the output CO of the signal combining means CM. The signal combining means CM may function as a summer, if the replica jamming signal provided by the replica jamming signal generator RSG is phase reversed with respect to the incoming jamming signal, or alternatively as a difference or subtracting circuit, if the replica jamming signal provided by the replica jamming signal generator is in phase with the incoming jamming signal.

The jamming signal receiver is an FLL type receiver being referred to as FLL jamming signal receiver and includes a frequency locked loop (FLL) comprising a pair of in-phase and phase quadrature tuning mixers M1 and M2, signal inputs si1 and si2 thereof being coupled to the output CO of said signal combining means CM and carrier inputs ci1 and ci2 thereof being coupled to in-phase and phase quadrature oscillator outputs, respectively, of a local voltage controlled oscillator (VCO). A tuning control signal Vt is supplied by a tuning control signal generator TCG through a summer S2 and a frequency control input to the VCO for coarse tuning the jamming signal receiver JR at, or within the capture range of the FLL from, a known carrier modulated jamming signal. The tuning control signal generator TCG deriving said tuning control signal Vt from predetermined tuning data defining the carrier frequency or frequencies of one or more known carrier modulated jamming signals. Such known jamming signals are e.g. Bluetooth and/or WiFi base station transmitting signals, radar and/or GPS signals.

The VCO is included in the FLL, which comprises, subsequent to the VCO, said pair of in-phase and phase quadrature tuning mixers M1 and M2, as well as a frequency detector FD providing a frequency control signal to the summer S2, in which said frequency control signal is added to the tuning control signal Vt. The so combined frequency control signal locks the frequency of the VCO to the carrier frequency of the jamming signal. The VCO therewith provides frequency locked in-phase and phase quadrature local oscillator signals to the carrier inputs of the in-phase and phase quadrature tuning mixers for a downconversion of said jamming signal into a quadrature IF jamming signal. Outputs of said in-phase and phase quadrature tuning mixers M1 and M2 are coupled respectively through in-phase and phase quadrature IF filters IFI and IFQ to signal inputs si3 and si4 of a pair of in-phase and phase quadrature tracking modulators M3 and M4. The in-phase and phase quadrature tracking modulators M3 and M4 are included in the replica jamming signal generator RSG, carrier inputs ci3 and ci4 thereof being coupled respectively to the in-phase and phase quadrature oscillator outputs of said VCO for an upconversion of said quadrature IF jamming signal to the carrier frequency of the carrier modulated jamming signal. Outputs of said in-phase and phase quadrature tracking modulators M3 and M4 are coupled to a summer stage S1 to provide a replica jamming signal, which is negatively feedback from said summer stage S1 to the second input CI2 of the signal combining means CM.

The FLL jamming signal receiver JR converts the incoming jamming signal into a pair of quadrature jamming signals at a certain predetermined intermediate frequency (IF), which may be chosen non-zero, or alternatively zero. In the first case the FLL jamming signal receiver JR is functioning as a superheterodyne FLL receiver in which each of said in-phase and phase quadrature IF filters IFI and IFQ provide a band pass filter characteristic. In the second case the FLL jamming signal receiver JR functions as a zero IF FLL receiver in which each of said in-phase and phase quadrature IF filters IFI and IFQ provide a low pass filter characteristic. Such low pass filters may alternatively be implemented as integrators.

The downconversion of the incoming jamming signal in M1 and M2 allows for a narrowband IF or baseband selection thereof using bandpass or, respectively, low pass filters for said in-phase and phase quadrature IF filters IFI and IFQ. The local oscillator frequency of the VCO preserves the exact carrier frequency of the received jamming signal. The exact phase of the received jamming signal is available in the pair of quadrature IF or baseband jamming signals. With these preserved signal components a replica jamming signal can be generated by remodulating in tracking in-phase and phase quadrature modulators M3 and M4, the selected quadrature IF jamming signal to the carrier frequency of the incoming jamming signal in said replica jamming signal generator RSG. By mutually adding the in-phase and phase quadrature output signals of M3 and M4 in the summer stage S1, a replica jamming signal is obtained, which accurately corresponds to the original jamming signal. The jamming signal may be of any type, such as a double sideband carrier modulated signal, a vestigial sideband carrier modulated signal, a single sideband carrier modulated signal, etc.

The reduction of the incoming jamming signal, depends on the phase and gain requirements of the negative jamming signal feedback loop as provided by the jamming signal FLL receiver JR and the replica jamming signal generator RSG. The loop has to reverse the signal phase, i.e. effectuate a 180° phase shift, of the replica jamming signal compared to the phase of the incoming jamming signal. The phase reversal may be obtained by using a subtractor as signal combining means CM with a non-inversing first input CI1 and an inversing second input CI2 and coupling the output of the negative jamming signal feedback loop JR, RSG to the inversing second input CI2 of the signal combining means CM. As the suppression of the jamming signal increases with an increasing open loop gain, a feedback loop amplifier FBA is coupled between the summer stage S1 and the inversing second input CI2 of the signal combining means CM to secure a sufficiently large open loop gain.

FIG. 1A shows a preferred embodiment of the anti jamming system according to the invention of FIG. 1 allowing for a correction of phase errors which may occur in the circuitry of the jamming signal receiver JR and/or the replica jamming signal generator RSG, which may be caused e.g. by parasitic phenomena, which otherwise would deteriorate the negative feedback of the replica jamming signal to the signal combining means CM. Phase correction may alternatively be provided in the RF domain and/or the IF/baseband domain, for which reason the respective relevant phase correction means are shown in dotted lines.

RF phase correction may be obtained by using RF phase correction means PCRF having a pair of phase quadrature inputs coupled to the in-phase and phase quadrature oscillator outputs of the local voltage controlled oscillator (VCO) and having in-phase and phase quadrature outputs coupled to the carrier inputs ci3 and ci4 of the in-phase and phase quadrature tracking modulators M3 and M4. The RF phase correction means PCO provides an adjustment of the phase angle between the in-phase and phase quadrature local oscillator signals of the VCO e.g. by properly chosen mutual combinations of these in-phase and phase quadrature local oscillator signals resulting in phase corrected RF in-phase and phase quadrature carrier signals for the in-phase and phase quadrature tracking modulators M3 and M4.

Alternatively, IF or baseband signal phase correction may likewise be provided by using IF or baseband phase correction means PCIF providing an adjustment of the phase angle between the in-phase and phase quadrature IF or baseband signals, as the case may be, at the outputs of the in-phase and phase quadrature IF filters IFI and IFQ by properly chosen mutual combinations of these in-phase and phase quadrature IF or baseband signals, resulting in phase corrected in-phase and phase quadrature IF or baseband signals being supplied to signal inputs si3 and si4 of the in-phase and phase quadrature tracking modulators M3 and M4.

The implementation of the RF phase correction means PCRF and the IF in-phase and phase quadrature phase correction means PCIF lies within the normal ability of the skilled person and no further amplification is needed for a proper understanding of the invention.

To provide an extra degree of freedom allowing optimizing the FLL function independent from an optimized dimensioning of the negative jamming signal feedback loop, the frequency detector FD is preceded by in-phase and phase quadrature FLL loop filters LPI and LPQ coupled to the in-phase and phase quadrature IF filters IFI and IFQ, respectively.

The signal combining means CM as shown in FIGS. 1 and 1A may be implemented by an adder also referred to as summer, with first and second non-inversing inputs, or by a subtractor as mentioned above, dependent on the phase of the replica jamming signal as provided by the replica jamming signal generator RSG. A summer may be used in case the replica jamming signal as provided by the replica jamming signal generator RSG is in phase opposition with respect to the incoming jamming signal. If both the replica jamming signal and the incoming jamming signal are current signals, a simple common node as shown in FIG. 2A could provide a summer function for said signal combining means CM. In such common node, first and second inputs CI1 and CI2 and output CO of the signal combining means CM coincide. In such node implementation of the signal combining means CM the node constitutes input and output of the jamming signal suppression system as well as input and output of the negative jamming signal feedback loop JR, RSG, at which the suppression of the incoming jamming signal is occurring. A receiver REC being coupled to the common node receives the input signal with only a strongly suppressed carrier modulated jamming signal. For a proper impedance matching the input impedance of the jamming receiver JR should be relatively high ohmic, whereas the input impedance of the receiver REC should be low ohmic, e.g. 50Ω.

FIG. 2B shows an implementation of the signal combining means CM by means of a voltage signal adder, in which the first and the second inputs CI1 and CI2, and the output CO of the signal combining means CM are coupled through resistors R to a common node. This implementation allows for the use of mutually equal relatively low ohmic input/output impedances of the circuitry coupled to the first and the second inputs CI1 and CI2. An input of a receiver REC being coupled in common with the input of the jamming receiver JR of the negative jamming signal feedback loop JR, RSG to the output CO of the signal combining means CM receives the input signal with only a strongly suppressed carrier modulated jamming signal.

FIG. 3 shows a block diagram of a second embodiment of an anti jamming system according to the invention comprising in-phase and phase quadrature FLL loop filters FFI and FFQ coupled between the outputs of tuning mixers M1 and M2 on the one hand and the frequency detector FD on the other hand. These in-phase and phase quadrature FLL loop filters FFI and FFQ allow for an optimization of the FLL loop independent from the dimensioning of the negative jamming feedback loop JR, RSG.

Outputs of the in-phase and phase quadrature FLL loop filters FFI and FFQ are coupled to an input of an RMS envelope detector measuring the Root Mean Square value of the envelope of the incoming jamming signal and converting the same into a gain control signal for the feedback loop amplifier FBA for an automatically controlled increase of the loop gain at an increase of the RMS value of the envelope signal and vice versa. This allows for an automatic stabilization of the suppression of the incoming signal at a wanted level.

To suppress jamming signals having unknown carrier frequencies, the anti jamming system of this FIG. 3 includes a search tuning system using a microprocessor uP executing the method as illustrated in FIG. 4 including the steps of:
  controlling a switch SW to switch off or deactivate the negative jamming feedback suppression;
  scanning the RF frequency band to detect carrier frequencies of jamming signals exceeding above a predetermined threshold value;
  storing the detected carrier frequencies;
  upon completion of the scanning operation, selecting the carrier frequency of the strongest jamming signal frequency not coinciding with the RF frequency of a wanted signal;
  supplying a tuning control signal to the VCO to tune the FLL receiver at the carrier of the so selected jamming signal;
  controlling switch SW to switch on or activate the negative jamming feedback suppression.

In the embodiment shown the switch SW is inserted between the output of the replica signal generator RSG on the one hand and the second input CI2 of the signal combining means CM.

FIG. 5 shows a block diagram of an anti jamming system according to the invention being provided with a plurality of tunable negative jamming signal feedback loops JR1, SRG1 to JRi, SRGi from the output CO of the signal combining means CM to its second input CI2 for suppressing a plurality of jamming signals. The microprocessor uP now executes a search and tuning method as shown in FIG. 6 for each of the tunable negative jamming signal feedback loops JR1, SRG1 to JRi, SRGi. Per each such tunable negative jamming signal feedback loop one jamming signal is suppressed. The number i can in principle be chosen to correspond to the number of jamming signals to be suppressed.

FIG. 6A shows a block diagram of a receiver using an anti jamming system CM, JR, RSG according to the invention in the RF signal path. In this embodiment, the signal combining means CM is constituted by a common node mutually interconnecting the antennae means ANT, the input of the jamming receiver JR, the output of the replica signal generator RSG and an RF input of an REC. A jamming signal included in the RF antennae input signal is being suppressed in the negative jamming signal feedback loop resulting at the common node of the signal combining means CM in an RF input signal for the useful RF signal receiver REC, which is freed from said jamming signal.

FIG. 6B a block diagram of a receiver receiving an RF antennae signal from antennae means ANT being supplied through an RF input circuit RFI to a mixer stage M. The mixer stage M is being provided with a local oscillator signal from a tunable oscillator TO to convert a wanted RF signal into an IF signal. The mixer stage M is followed by an IF filter IFF for a selection of said IF signal. The IF filter IFF is coupled to the first input CI1 of the signal combining means CM of an anti jamming system CM, JR, RSG according to the invention. The output CO of the compensation means CM is coupled to a demodulator DEM of the RF receiver, which is followed by a baseband signal processor SP. The RF receiver may be an FM and/or AM radio receiver, in which case the demodulator is an FM and/or AM demodulator and the baseband signal processor SP includes audio signal processing and reproduction means.

Now, the present invention has hereabove been disclosed with reference to preferred embodiments thereof. The invention may be applied in the RF, IF and/or AF or baseband signal paths of existing receivers and is suitable for implementation in digital or analogue form. If implemented in digital form, then the anti jamming system is to be preceded by an AD converter and all elements of the tunable negative jamming signal feedback loop, including the FLL jamming receiver JR, the replica jamming signal generator RSG and the signal combining means CM may be implemented by means of logic circuitry or other digital devices. Also, the jamming system according to the invention in applicable to a wide range of receiver categories, including not only FM and/or AM radio receivers and television receivers, but also to the receiver part of mobile telephones, in GPS receivers, in radar equipment, etcetera.

Persons skilled in the art will recognize that numerous modifications and changes may be made thereto without exceeding the scope of the appended Claims. Such modification may involve e.g. the use of a plurality of negative jamming signal feedback loops JR1, SRG1 to JRi, SRGi in the embodiment of FIG. 1 for suppressing a plurality of known jamming signals, i.e. without an automatic jamming signal search tuning, and/or the replacement of circuitry, such as the replacement of the RMS detector by an amplitude detector. Another modification may be applied to a microprocessor already present in the receivers of FIGS. 6A and 6B e.g. for searching alternative RDS frequencies, for the purpose of additionally searching jamming signals similar to the microprocessor uP of FIG. 3. Furthermore, the phase correction measures as shown in the embodiment of FIG. 1A which are to compensate for phase errors, if any, may also be applied in the anti jamming system of FIG. 3 or 5. At a properly chosen mutually balanced phase relations, the in-phase and phase quadrature local oscillator signals of the VCO may well be cross coupled to the carrier inputs of the phase quadrature and in-phase tracking modulators M3 and M4, respectively. Alternatively, the in-phase and phase quadrature local oscillator signals of the VCO may well be cross coupled to the carrier inputs of the phase quadrature and in-phase tuning mixers M1 and M2, respectively, or the summer stage S1 may effectuate a phase reversal of one of the pair of quadrature input signals, allowing to use a differential stage for the summer stage S1. In consequence, the embodiments should be considered as being illustrative, and no restriction should be construed from those embodiments, other than as have been recited in the Claims.

Throughout the specification, and in the claims, the term "coupled" means either a direct electrical connection between the things that are connected, or an indirect connection through one or more passive or active intermediary systems. The term "circuit" means one or more passive and/or active components that are arranged to cooperate through digital or analogue signals with one another to provide a desired function. The term "signal" means at least one current signal, voltage signal, electromagnetic wave signal, or data signal. The meaning of "a", "an", and "the" include plural references. The meaning of "in" includes "in" and "on".

The invention claimed is:

1. An anti jamming system comprising:
   a signal combiner that includes a first input, a second input, and an output, the first input being configured to receive an input signal that includes a carrier modulated jamming signal; and
   a jamming signal feedback loop that includes:
      a quadrature frequency locked loop receiver for demodulating and selecting the jamming signal, and
      a replica jamming signal generator for generating a replica jamming signal that is coupled to the second input to provide feedback suppression of the jamming signal from the output of the signal combiner.

2. The system of claim 1, wherein:
   the FLL receiver includes:
      a voltage controlled oscillator (VCO) that provides a pair of in-phase and phase quadrature oscillator outputs;
      a pair of in-phase and phase quadrature tuning mixers that include signal inputs, carrier inputs, and quadrature outputs, the signal inputs being coupled to the output of the signal combiner, and the carrier inputs being coupled to the pair of in-phase and phase quadrature oscillator outputs, the quadrature outputs providing a downconversion of the jamming signal into a quadrature IF jamming signal included in said
   the frequency locked loop (FLL) and includes a frequency detector that is coupled to a frequency control input of the VCO to lock the frequency of the VCO to a carrier frequency of the jamming signal, and
   the replica jamming signal generator includes:
      in-phase and quadrature IF filters that are coupled to the quadrature outputs,
      in-phase and quadrature tracking modulators having signal inputs that are coupled to outputs of the IF filters, carrier inputs that are coupled to the pair of in-phase and phase quadrature oscillator outputs, and outputs that provide an upconversion of the quadrature IF jamming signal into a quadrature jamming signal, and
      a summer stage that receives the outputs of the in-phase and phase quadrature tracking modulators to provide the replica jamming signal.

3. The system of claim 2, wherein in-phase and phase quadrature oscillator signals are respectively coupled to the in-phase and phase quadrature tuning mixers, the in-phase and phase quadrature tuning mixers are respectively coupled to the in-phase and phase quadrature tracking modulators, and the in-phase and phase quadrature tracking modulators are respectively coupled to the in-phase and phase quadrature oscillator signals.

4. The system of claim 1, wherein the replica jamming signal is opposite in phase to the carrier modulated jamming signal and the signal combiner includes an adder that is configured to add the carrier modulated jamming signal and the replica jamming signal.

5. The system of claim 2, wherein the in-phase and phase quadrature IF filters provide a low pass filter characteristic.

6. The system of claim 2, wherein the in-phase and phase quadrature IF filters provide a band pass filter characteristic.

7. The system of claim 1, including an amplifier that provides an open loop gain of the jamming signal feedback loop that is substantially larger than unity.

8. The system of claim 7, wherein an envelope detector is coupled between the quadrature outputs of the in-phase and phase quadrature tuning mixers to provide an amplitude of an envelope of the jamming signal, and a gain control input of the amplifier that is configured to vary the gain of the amplifier based on an the amplitude.

9. The system of claim 2, wherein the in phase and phase quadrature FLL loop filters precede the frequency detector.

10. The system of claim 2, wherein the replica signal generator includes an RF phase corrector that is coupled between the local voltage controlled oscillator (VCO) and the quadrature pair of tracked modulators.

11. The system of claim 2, wherein the replica signal generator includes an IF phase corrector that is coupled between the quadrature pair of in-phase and phase quadrature IF filters and the quadrature pair of tracked modulators.

12. The system of claim 2, including a tuning control signal generator that derives a tuning control signal from predetermined tuning data that defines the carrier frequency of the jamming signal.

13. The system of claim 1, including one or more other jamming signal feedback loops, each being tuned to a carrier frequency of a respective other jamming signal.

14. The system of claim 1, including a microprocessor that is configured to:
   deactivate the jamming signal feedback loop;
   scan an RF frequency band to detect carrier frequencies of jamming signals above a predetermined threshold value;
   store the detected carrier frequencies;
   select the carrier frequency of a strongest jamming signal frequency not coinciding with an RF frequency of a wanted signal;
   supply a tuning control signal to the VCO to tune the FLL receiver at the selected carrier frequency; and
   activate the jamming signal feedback loop.

15. A receiving system comprising:
   a receiver that is configured to receive an input signal and produce therefrom a baseband signal
   a jamming receiver that is configured to detect a jamming signal in the input signal at a jamming frequency,
   a replica signal generator that is configured to generate a replica jamming signal at the jamming frequency, and
   a combiner that is configured to combine the input signal and the replica jamming signal so as to substantially cancel effects of the jamming signal on the baseband signal.

16. The system of claim 15, wherein the jamming receiver includes a quadrature frequency-locked loop that is configured to detect a carrier frequency of the jamming signal, and to provide this carrier frequency as the jamming frequency.

17. The receiving system of claim 16, wherein:
   the frequency-locked loop includes:
      an oscillator that provides in-phase and phase quadrature oscillator outputs;
      a pair of in-phase and phase quadrature tuning mixers that include:
         signal inputs coupled to the output of the combiner,
         carrier inputs coupled to the pair of in-phase and phase quadrature oscillator outputs, and
         quadrature outputs that provide a downconversion of the jamming signal into a quadrature IF jamming signal;
   the replica signal generator includes:
      in-phase and quadrature tracking modulators having:
         signal inputs that are coupled to quadrature outputs of the jamming receiver,
         carrier inputs that are coupled to the in-phase and phase quadrature oscillator outputs, and
         outputs that provide an upconversion of the quadrature IF jamming signal into a quadrature jamming signal; and
      a summer stage that combines the outputs of the in-phase and quadrature tracking modulators to provide the replica jamming signal.

18. The receiving system of claim 15, wherein the combiner is configured to be placed in an RF stage of the receiving system.

19. The receiving system of claim 15, wherein the combiner is configured to be placed in an IF stage of the receiving system.

20. The receiving system of claim 15, wherein the combiner is configured to be placed in a baseband stage of the receiving system.

* * * * *

UNITED STATES PATENT AND TRADEMARK OFFICE
CERTIFICATE OF CORRECTION

PATENT NO. : 8,350,745 B2
APPLICATION NO. : 12/682250
DATED : January 8, 2013
INVENTOR(S) : Kasperkovitz et al.

Page 1 of 1

It is certified that error appears in the above-identified patent and that said Letters Patent is hereby corrected as shown below:

On the Title Page:

Please REPLACE the ABSTRACT of the referenced patent with the following abstract:

An anti-jamming system that includes a tunable negative jamming signal feedback loop for feedback suppression of a jamming signal received at a first input of a signal combiner, such as a summer. An output of the signal combiner is coupled through a negative jamming signal feedback loop to a second input of the signal combiner. The feedback loop includes a quadrature frequency locked loop (FLL) receiver for demodulating and selecting the jamming signal from the output of the signal comber, followed by a replica jamming signal generator for generating a replica jamming signal corresponding to the jamming signal. The replica jamming signal is supplied to the second input of the signal combiner, to provide a negative feedback suppression of the jamming signal in the signal combining means.

Signed and Sealed this
Seventh Day of May, 2013

Teresa Stanek Rea
*Acting Director of the United States Patent and Trademark Office*